(12) United States Patent
Sandy et al.

(10) Patent No.: US 7,242,578 B2
(45) Date of Patent: Jul. 10, 2007

(54) N/2 SLOT SWITCH MODULE

(75) Inventors: Douglas L. Sandy, Chandler, AZ (US); Mark S. Lanus, Tempe, AZ (US); Robert C. Tufford, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 442 days.

(21) Appl. No.: 10/441,705

(22) Filed: May 20, 2003

(65) Prior Publication Data

US 2004/0233652 A1 Nov. 25, 2004

(51) Int. Cl.
*G06F 1/16* (2006.01)
(52) U.S. Cl. ...................................... 361/686; 361/788
(58) Field of Classification Search ................ 361/780, 361/785, 803, 784, 790; 710/301, 316, 305
See application file for complete search history.

(56) References Cited

U.S. PATENT DOCUMENTS

| | | | | |
|---|---|---|---|---|
| 5,892,932 | A * | 4/1999 | Kim ........................... | 710/316 |
| 6,711,028 | B2 * | 3/2004 | Iny ............................. | 361/788 |
| 6,789,151 | B1 * | 9/2004 | Benson et al. .............. | 710/305 |
| 2002/0023184 | A1 | 2/2002 | Paul | |
| 2002/0044562 | A1 | 4/2002 | Killeen et al. | |
| 2003/0039014 | A1 * | 2/2003 | English ....................... | 359/163 |

FOREIGN PATENT DOCUMENTS

| | | |
|---|---|---|
| EP | 0 469 197 A | 2/1992 |
| EP | 0 701 347 A | 3/1996 |
| WO | WO 02/10930 A | 2/2002 |

OTHER PUBLICATIONS

PCI Industrial Computer Manufacturers Group: "Packet Switching Backplane Specification Passage", Packet Switching Backplane Specification, Sep. 5, 2001, pp. I-II, XP009041090.
Anonymous: "Next-Generation Backplanes" Elma Bustronic. [Online] Aug. 3, 2002, XP002262795 retrieved from the Internet: URL:http://web.archive.org/web/20020803110952/http://www.nextgenbackplanes.com/switch.html> [retrieved on Nov. 25, 2003], the whole document.

* cited by examiner

*Primary Examiner*—Kamand Cuneo
*Assistant Examiner*—Ivan Carpio
(74) *Attorney, Agent, or Firm*—Kevin D. Wills

(57) ABSTRACT

A bladed architecture, backplane-based network (100) having N payload slots (108) includes an N/2 slot switch module (102), wherein the N/2 slot switch module is reconfigurable to one of a left-hand slot switch configuration (603) and a right-hand slot switch configuration (605), and wherein the N/2 slot switch module is coupled to N/2 of the N payload slots such that the bladed architecture, backplane-based network is in a sub-optimal configuration (601).

12 Claims, 7 Drawing Sheets

*-PRIOR ART-*

N/2 SLOT SWITCH MODULE

RELATED APPLICATIONS

Related subject matter is disclosed in U.S. patent application entitled "METHOD OF CONFIGURING A COMPUTER NETWORK HAVING AN N/2 SLOT SWITCH MODULE" having application Ser. No. 10/441,696 and filed on the same date herewith and assigned to the same assignee.

Related subject matter is disclosed in U.S. patent application entitled "COMPUTER NETWORK HAVING AN N/2 SLOT SWITCH MODULE" having application Ser. No. 10/441,704 and filed on the same date herewith and assigned to the same assignee.

BACKGROUND OF THE INVENTION

With the convergence of telecom/datacom switching centers and traditional LAN and Internet-based data centers, a distributed server architecture based on "blades" is emerging. In a bladed architecture, backplane-based computer network using switched fabric technology, first generation switch chips do not permit the construction of a fully-connected switch module. A fully-connected switch module is one that is coupled to all available payload slots in the bladed architecture, backplane-based computer network. Fully-connected switch modules using a switched fabric network standard are difficult to construct due in part to thermal constraints, insufficient space on the switch card, and high cost coupled with the low demand for full connectivity.

Therefore, it is desirable to have a switch module that offers less than full-connectivity and yet is flexible to operate at different performance points within different sized networks. It is also desirable to have a switch card that is reconfigurable after manufacture to provide the flexibility in a bladed architecture, backplane-based environment, while supporting different sized chassis and a varied number of payload slots.

Accordingly, there is a significant need for an apparatus and method that overcomes the deficiencies of the prior art outlined above.

BRIEF DESCRIPTION OF THE DRAWINGS

Referring to the drawing.

Figure 1:
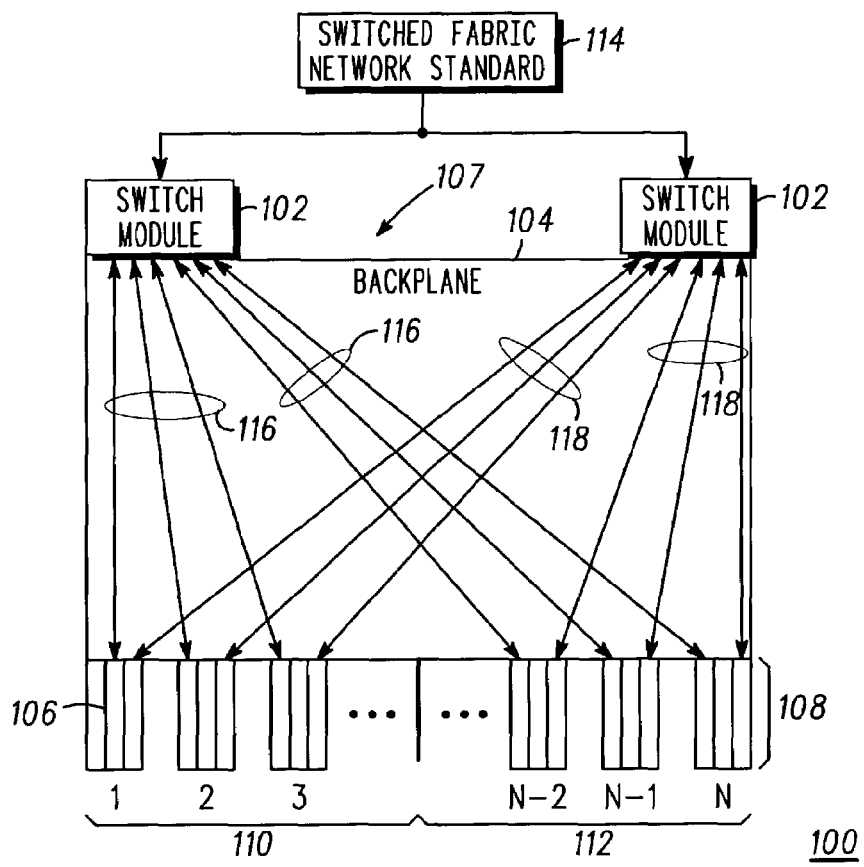
FIG. 1 depicts a computer network according to one embodiment of the invention.

It will be appreciated that for simplicity and clarity of illustration, elements shown in the drawing have not necessarily been drawn to scale. For example, the dimensions of some of the elements are exaggerated relative to each other. Further, where considered appropriate, reference numerals have been repeated among the Figures to indicate corresponding elements.

DESCRIPTION OF THE PREFERRED EMBODIMENTS

In the following detailed description of exemplary embodiments of the invention, reference is made to the accompanying drawings, which illustrate specific exemplary embodiments in which the invention may be practiced. These embodiments are described in sufficient detail to enable those skilled in the art to practice the invention, but other embodiments may be utilized and logical, mechanical, electrical and other changes may be made without departing from the scope of the present invention. The following detailed description is, therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact. However, "coupled" may mean that two or more elements are not in direct contact with each other, but yet still co-operate or interact with each other.

For clarity of explanation, the embodiments of the present invention are presented, in part, as comprising individual functional blocks. The functions represented by these blocks may be provided through the use of either shared or dedicated hardware, including, but not limited to, hardware capable of executing software. The present invention is not limited to implementation by any particular set of elements, and the description herein is merely representational of one embodiment.

FIG. 1 depicts a computer network 100 according to one embodiment of the invention. More particularly, FIG. 1 depicts a bladed architecture, backplane-based network 100. In the most general sense, a blade in a network is an industry-standard computer delivered on a single card that can be plugged as a module into a chassis. In various embodiments of the invention, a chassis may have anywhere from eight to twenty-four payload slots and therefore accept from eight to twenty-four such payload modules 106 or "blades." As defined, this blade is not able to operate standalone but requires the chassis to provide power, cooling and rigidity. Backplane-based networks are well known in the art.

As shown in FIG. 1, network 100 can comprise two switch modules 102 coupled to N payload slots 108, where N represents the number of payload slots available for a particular network or chassis. Each of N payload slots 108 can contain a payload module 106, where each payload module 106 represents a "blade" as discussed above. Each of N payload slots 108 (and its corresponding payload module 106) are configured to be coupled to two switch modules 102. In effect, each of N payload slots can have a left link 116 and a right link 118. In an embodiment, a left link 116 can be coupled to a left-hand switch slot in a computer chassis, and the right link 118 can be coupled to a right-hand switch slot in a computer chassis as discussed more fully below.

Payload modules 106 can add functionality to network 100 through the addition of processors, memory, storage devices, I/O elements, and the like. In other words, payload module 106 can include any combination of processors, memory, storage devices, I/O elements, and the like, to give network 100 the functionality desired by a user.

The bladed architecture, backplane-based network 100 shown in FIG. 1 is in a dual-star configuration, where each of N payload slots 108 is coupled to two switch modules 102 through the left link 116 and right link 118 defined above. Since each of N payload slots 108 is coupled to two switch modules 102, this is a fully-connected network and is considered an optimal configuration. This allows for redundancy in network 100 by allowing payload modules 106 inserted in the N payload slots 108 to use either switch module 102 to access network 100 or other payload modules 106 within network 100. Also, switch modules 102 can communicate with each other as represented by the line connecting each switch module 102. The invention is not limited to dual-star configurations and other network 100 configurations are within the scope of the invention. For example, and without limitation, star configurations, layered dual-star configurations, and the like.

Switch modules 102 are coupled to N payload slots 108 via backplane 104. The wiring in backplane 104 connecting switch modules 102 and N payload slots 108 is fixed at the time of manufacture and generally cannot be modified by a user. Network 100 shown in FIG. 1 could have various configurations. However, providing a different backplane 104 for each configuration is inefficient for the manufacturer and seller of backplane 104 and is expensive for a user who desires to upgrade a computer system to a different configuration.

In an embodiment, network 100 can have left-hand set of payload slots 110 and right-hand set of payload slots 112. Since the wiring configuration of backplane 104 is fixed, a switch module 102 needs to be manufactured such that it is configured to couple with any of the left-hand set of payload slots 110 and right-hand set of payload slots 112. In the prior art, a switch module was manufactured differently depending on whether it is designed for insertion on the "left" or "right" hand side of the network and could not be modified after manufacture. The different configurations have to do with the plurality of links on the switch module and how that plurality of links couples a plurality of switches on the switch module 102 to the backplane links to communicate with N payload slots 108.

In an embodiment of the invention, bladed architecture, backplane-based network 100 can be a switched fabric network 107. Switched fabric network 107 uses switch module 102 as a central switching hub with any number of N payload slots 108 coupled to switch module 102. In an embodiment, switched fabric network 107 can be based on a point-to-point, switched input/output (I/O) fabric, whereby cascaded switch devices interconnect end node devices. Switched fabric network 107 can include both module-to-module (for example computer systems that support I/O module add-in slots) and chassis-to-chassis environments (for example interconnecting computers, external storage systems, external Local Area Network (LAN) and Wide Area Network (WAN) access devices in a data-center environment). Switched fabric network 107 can be implemented by using one or more of a plurality of switched fabric network standards 114, for example and without limitation, InfiniBand™, Serial RapidIO™, FibreChannel™, Ethernet™, PCI Express™, Hypertransport™, and the like. Switched fabric network 107 is not limited to the use of these switched fabric network standards and the use of any switched fabric network standard is within the scope of the invention.

Figure 2:
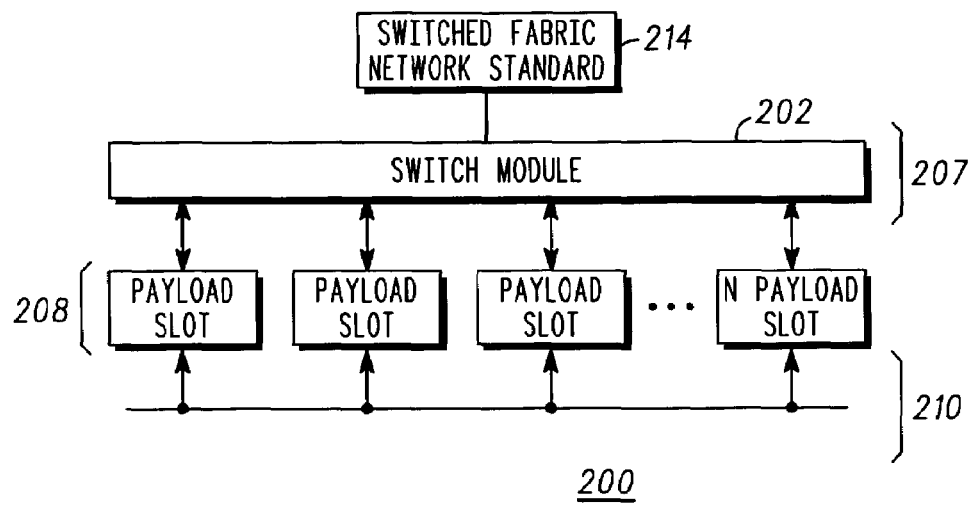
FIG. 2 depicts a multi-service platform system according to an embodiment of the invention.

FIG. 2 depicts a multi-service platform system 200 according to an embodiment of the invention. In an embodiment, multi-service platform system 200 can comprise a parallel bus network 210 and a switched fabric network 207 coupled to N payload slots 208. In other words, in an embodiment, multi-service platform system 200 can be a parallel bus multi-service platform system having a switched fabric network 207.

Parallel bus network 210 can be a parallel multi-drop bus network that is known in the art. In an embodiment, parallel bus network 210 can be a VERSAmodule Eurocard (VMEbus) parallel bus network as defined in the ANSI/VITA 1-1994 and ANSI/VITA 1.1-1997 standards, promulgated by the VMEbus International Trade Association (VITA), P.O. Box 19658, Fountain Hills, Ariz., 85269 (where ANSI stands for American National Standards Institute). In an embodiment of the invention, parallel bus network 210 can include VMEbus based protocols such as Single Cycle Transfer protocol (SCT), Block Transfer protocol (BLT), Multiplexed Block Transfer protocol (MBLT), Two Edge VMEbus protocol (2eVME) and Two Edge Source Synchronous Transfer protocol (2eSST). In this particular embodiment, parallel bus network 210 is not limited to the use of these VMEbus based protocols and other VMEbus based protocols are within the scope of the invention.

Parallel bus network 210 is not limited to a VMEbus network or protocols. Parallel bus network 210 can use any parallel bus protocols or architectures including, but not limited to Peripheral Component Interconnect (PCI and PCI-X), CompactPCI, Multibus, Futurebus, and the like.

Switched fabric network 207 and switched fabric network standards 214 are defined and discussed above with reference to FIG. 1. The embodiment depicted in FIG. 2 where multi-service platform system 200 comprises both VMEbus network 210 and switched fabric network 207 is outlined in the VITA 41 specification—VXS VMEbus Switched Serial Standard promulgated by VITA, P.O. Box 19658, Fountain Hills, Ariz., 85269 and herein incorporated by reference.

N payload slots 208 can a have payload module 106 that add functionality to multi-service platform system 200 through the addition of processors, memory, storage devices, I/O elements, and the like. In other words, payload module 106 can include any combination of processors, memory, storage devices, I/O elements, and the like, to give multi-service platform system 200 the functionality desired by a user.

As in network 100 in FIG. 1, multi-service platform system 200 can be controlled by a platform controller (not shown for clarity), which can include a processor for processing algorithms stored in memory. Memory comprises control algorithms, and can include, but is not limited to, random access memory (RAM), read only memory (ROM), flash memory, electrically erasable programmable ROM (EEPROM), and the like. Memory can contain stored instructions, tables, data, and the like, to be utilized by processor. Platform controller can be contained in one, or distributed among two or more payload modules 106 with communication among the various payload modules of multi-service platform system 200 occurring via parallel bus network 210 and/or switched fabric network 207. Platform controller can also be contained on switch module 202. Platform controller can control the functionality of multi-service platform system 200 including managing any payload modules 106 placed in N payload slots 208 to add functionality to the multi-service platform system 200.

In an embodiment of the invention, parallel bus network 210 and switched fabric network 207 operate concurrently within multi-service platform system 200. In one embodiment, switched fabric network 207 can operate in parallel with parallel bus network 210. In an example of an embodiment, parallel bus network 210 can operate as a control plane by synchronizing and organizing activities in multi-service platform system 200. Switched fabric network 207 can operate as a data plane by transferring data between individual payload modules 106. In this embodiment, data is transferred faster through the higher bandwidth switched fabric network 207, while the parallel bus network 210 controls and manages the overall system. This has the effect of increasing the speed of multi-service platform system 200 since data transfers that are in excess of parallel bus network 210 bandwidth can take place using switched fabric network 207.

In another embodiment of the invention, parallel bus network 210 can be used as the data plane and switched fabric network 207 can be used as the control plane. In yet another embodiment of the invention, parallel bus network 210 and switched fabric network 207 each can operate as both the control plane and the data plane.

Figure 3:
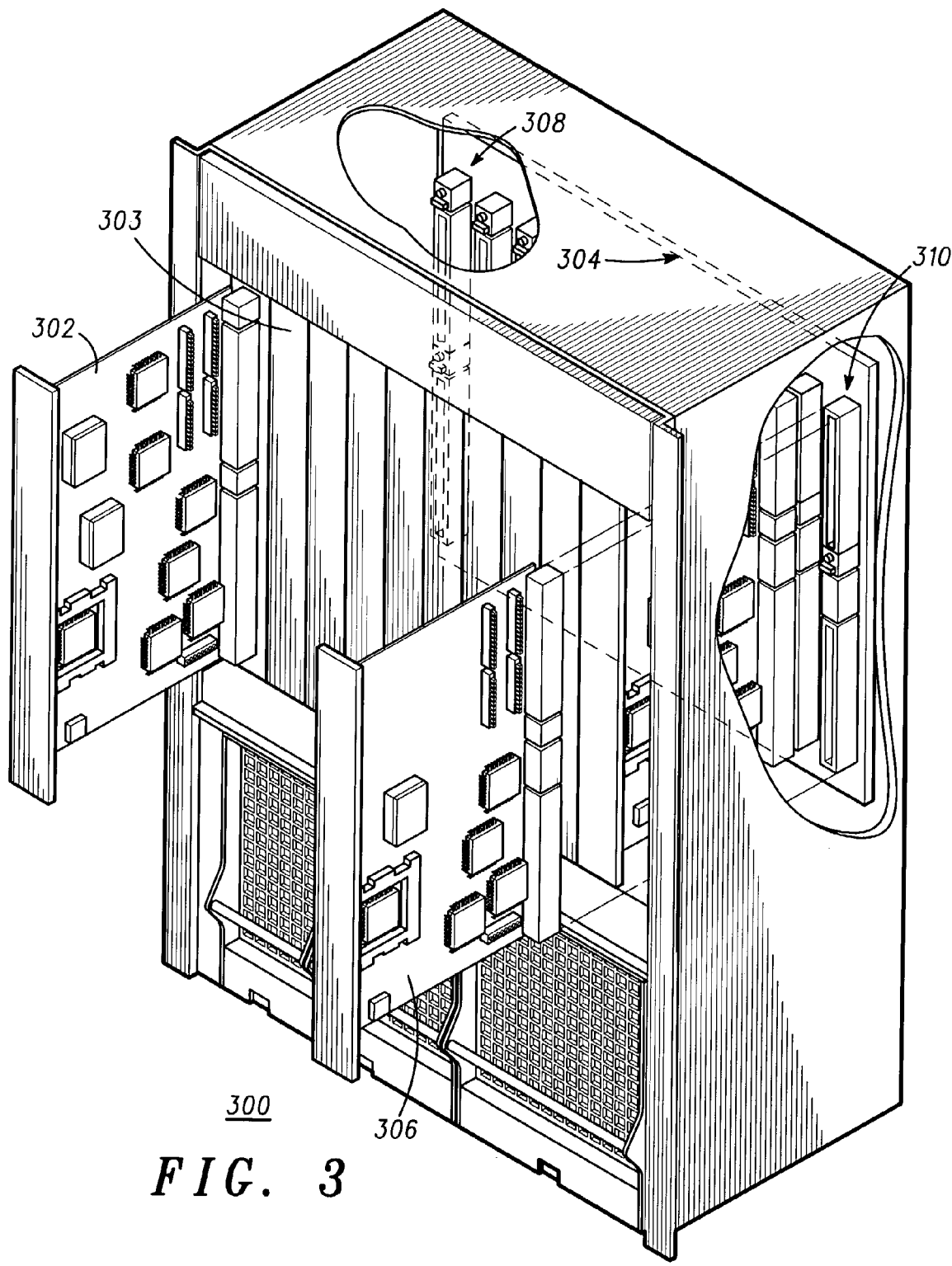
FIG. 3 depicts a computer chassis according to an embodiment of the invention.

FIG. 3 depicts a computer chassis 300 according to an embodiment of the invention. In an embodiment of the invention, chassis 300 can be a VXS chassis. As shown in FIG. 3, backplane 304 is used for connecting modules placed in slots 303. As an example of an embodiment, chassis 300 can include, for example and without limitation, Schroff Model 20836-200 manufactured by Pentair Electronic Packaging Company, 170 Commerce Drive, Warwick, R.I. 02886. The invention is not limited to this model or manufacturer and any multi-service platform system is included within the scope of the invention.

Backplane 304 can include first slot 310, which is designed to receive payload module 306. In an embodiment of the invention, backplane 304 and payload module 306 have a set of interlocking connectors designed to interlock with each other when payload module 306 is placed in first slot 310. When payload module 306 is placed in first slot 310 and coupled to backplane 304 the functionality of payload module 306 is added to network 100. For example, processors, memory, storage devices, I/O elements, and the like, on payload module 306 are accessible by other payload modules and visa versa.

In an embodiment of the invention, chassis 300 can include switch module 302 and second slot 308, where second slot 308 and backplane 304 are designed to receive switch module 302. When switch module 302 is inserted in second slot 308, switch module 302 is coupled to payload module 306 through backplane 304 as shown in FIG. 1. In an embodiment, switch module 302 can communicate with payload module 306 using a switched fabric network 207. In another embodiment, switch module 302 can communicate with payload module 306 using either switched fabric network 207 or parallel bus network 210. In FIG. 3 only one switch module 302 is shown for clarity and is not limiting of the invention. In an embodiment, two switch modules and their corresponding switch slots are present in computer chassis 300. These can be known as a left-hand switch slot and a right-hand switch slot. However, any number of switch modules 302 and payload modules 306 are within the scope of the invention.

Figure 4:
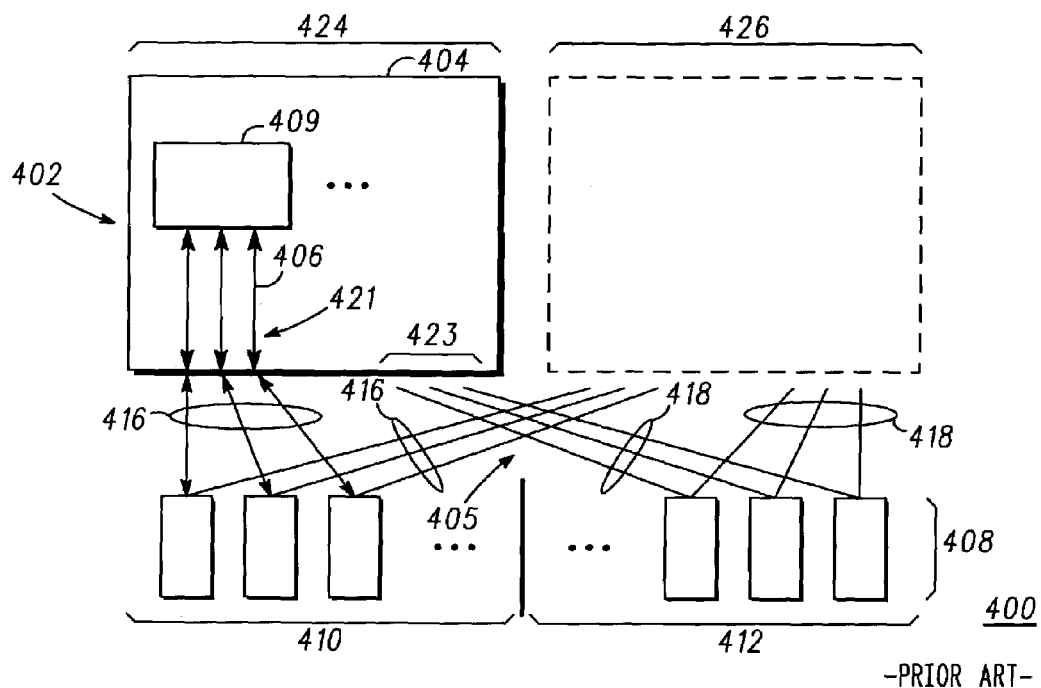
FIG. 4 depicts a prior art computer network.

FIG. 4 depicts a prior art computer network 400. Computer network 400 includes an N/2 slot switch module 402 coupled to interface with N/2 of N payload slots 408 of network 400. As shown in FIG. 4, N/2 slot switch module 402 can include switch card 404 and one or more switches 409 coupled to switch card 404. Switch card 404 can include a plurality of links 406 to connect each of the one or more switches 409 to backplane links 405 and to N/2 of N payload slots 408. Backplane links 405 can comprise left links 416 and right links 418 for each of N payload slots 408 as discussed above.

In the embodiment shown, N/2 slot switch module 402 is coupled to left-hand set of payload slots 410 via plurality of links 406 and backplane links 405. N/2 slot switch module 402 is coupled to network 400 at the interface of plurality of links 406 and backplane links 405. Data can be transmitted and/or received from a payload module along each one of the respective plurality of links 406 and backplane links 405.

As discussed above, each computer chassis 300 can have two switch slots, a left-hand switch slot 424 and a right-hand switch slot 426. The left-hand switch slot 424 is coupled to the left links 416 of each of N payload slots 408, and the right-hand switch slot 426 is coupled to the right links 418 of each of N payload slots 408. These connections are hardwired through backplane links 405. In the embodiment shown, N/2 slot switch module 402 does not connect to all of the backplane links 405 provided in left-hand switch slot 424. For example, N/2 slot switch module 402 does not connect with each of the left links 416 wired to left-hand switch slot 424. Since the N/2 slot switch module 402 is configured to connect with only N/2 slots, it will connect with only N/2 of the N payload slots 408. In the prior art, N/2 slot switch module had to be configured at manufacture to connect to the left-hand set of payload slots 410 or the right-hand set of payload slots 412. This can create an N/2 slot switch module 402 in either a left-hand slot switch configuration or a right-hand slot switch configuration respectively. A left-hand slot switch configuration refers to when one or more switches 409 are coupled to left-hand switch card link interface 421. A right-hand slot switch configuration occurs when one or more switches 409 are coupled to right-hand switch card link interface 423. N/2 slot switch module 402 shown in FIG. 4 is in a left-hand slot switch configuration since plurality of links 406 are wired to the left-hand switch card link interface 421.

In the prior art, plugging an N/2 slot switch module 402 with a left-hand slot switch configuration into a left-hand switch slot 424 couples the left-hand set of payload slots 410 to N/2 slot switch module 402 through the left links 416. Plugging an N/2 slot switch module 402 with a right-hand slot switch configuration (plurality of links 406 wired to right-hand switch card link interface 423) into a right-hand switch slot 426 couples the right-hand set of payload slots 412 to N/2 slot switch module 402 through the right links 418. Also, plugging an N/2 slot switch module 402 with a left-hand slot switch configuration into a right-hand switch slot 426 couples the left-hand set of payload slots 410 to N/2 slot switch module 402 through right links 418. An analogous result is obtained when plugging an N/2 slot switch module with a right-hand slot switch configuration into a left-hand switch slot 424.

Each of the above configurations creates a half-shelf, half-bandwidth network. A half-shelf network is where only N/2 of the N payload slots 408 are active as they are coupled to N/2 slot switch module 402. Therefore, only N/2 the N payload slots 408 can interface with the network 400, and the network 400 can see only N/2 of the N payload slots 408 and payload modules. A half-bandwidth network is where each of the N payload slots 408 is coupled to only one switch module. Therefore, there is no redundancy in the network 400 and a payload module can only send and receive data to/from one switch module, thereby limiting the data transfer rate between payload module and the rest of the network.

A disadvantage of the prior art is that the N/2 slot switch module 402 had to be configured at manufacture to be in either the left-hand slot switch configuration or the right-hand slot switch configuration. This provided no flexibility and greater costs as networks were expanded or modified.

Figure 5:
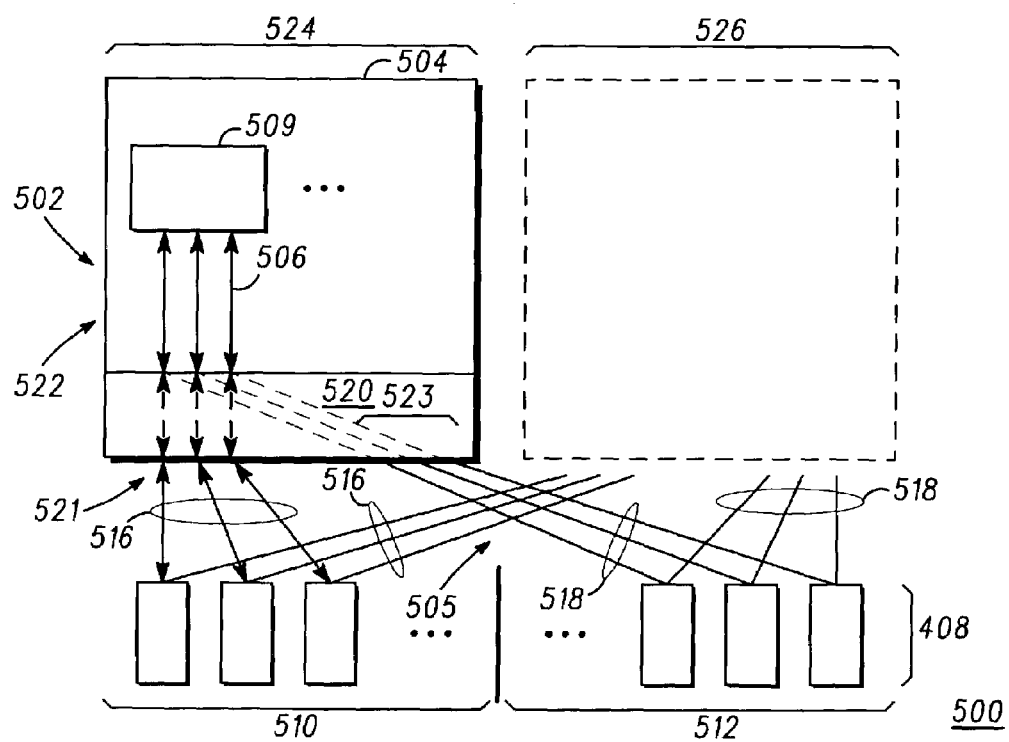
FIG. 5 depicts a computer network according to another embodiment of the invention.

FIG. 5 depicts a computer network 500 according to an embodiment of the invention. Computer network 500 includes an N/2 slot switch module 502 coupled to interface with N/2 of N payload slots 508 of network 500. As shown in FIG. 5, N/2 slot switch module 502 can include switch card 504 and one or more switches 509 coupled to switch card 504. Switch card 504 can include a plurality of links 506 to connect each of the one or more switches 509 to backplane links 505 and to N/2 of N payload slots 508. Backplane links 505 can comprise left links 516 and right links 518 for each of N payload slots 508 as discussed above. N/2 slot switch module 502 can also include reconfiguring means 520. As an example, switch 509 can be a Mellanox InfiniScale MT43132, manufactured by Mellanox Technologies, Inc., 2900 Stender Way, Santa Clara, Calif. 95954. This model of switch is not limiting of the invention, and any switch is within the scope of the invention.

In the embodiment shown, N/2 slot switch module 502 is coupled to left-hand set of payload slots 510 via plurality of links 506 and backplane links 505. Data can be transmitted and/or received from a payload module along each one of the respective plurality of links 506 and backplane links 505 through reconfiguring means 520. As discussed above, each computer chassis 300 can have two switch slots, a left-hand switch slot 524 and a right-hand switch slot 526. The left-hand switch slot 524 is coupled to the left links 516 of each of N payload slots 508, and the right-hand switch slot 526 is coupled to the right links 518 of each of N payload slots 508. These connections are hardwired through backplane links 505. In the embodiment shown, N/2 slot switch module 502 does not connect to all of the backplane links 505 provided in left-hand switch slot 524. For example, N/2 slot switch module 502 does not connect with each of the left links 516 wired to left-hand switch slot 524. Since the N/2 slot switch module 502 is configured to connect with only N/2 slots, it will connect with only N/2 of the N payload slots 508.

In the embodiment depicted in FIG. 5, N/2 slot switch module 502 is designed to interface with only N/2 of the N payload slots 508 available in network 500. Since N/2 slot switch module 502 is coupled to only a portion of the N payload slots 508, a sub-optimal configuration is created. An optimal configuration is discussed above with reference to the dual-star configuration in FIG. 1, where each of N payload slots 108 is coupled to two switch modules 102. In the optimal configuration, each of N payload slots 108 is coupled to two switch modules 102, creating a fully-connected network. This allows for redundancy in network 100 by allowing payload modules 106 inserted in the N payload slots 108 to use either switch module 102 to access network 100 or other payload modules 106 within network 100.

In an embodiment, a sub-optimal configuration includes the configuration where any of the N payload slots 108 and the corresponding payload modules are disconnected from at least one N/2 slot switch modules 502. In another embodiment, a sub-optimal configuration occurs when N/2 slot switch module 502 is disconnected from any of N payload slots 508.

The embodiment depicted in FIG. 5 includes reconfiguring means 520 coupled to switch card 504. Reconfiguring means 520 allows N/2 slot switch module 502 to be reconfigured into a left-hand slot switch configuration or a right-hand slot switch configuration as indicated by the dashed lines coupling plurality of links 506 and left-hand switch card link interface 521 or right-hand switch card link interface 523. A left-hand slot switch configuration refers to when one or more switches 509 are coupled to left-hand switch card link interface 521 via plurality of links 506. A right-hand slot switch configuration occurs when one or more switches 509 are coupled to right-hand switch card link interface 523 via plurality of links 506. In one embodiment of the invention, reconfiguring means 520 is interposed between plurality of links 506 and the interface of N/2 slot switch module 502 and backplane links 505. The embodiment depicted in FIG. 5 is not limiting of the invention. Reconfiguring means 520 can be coupled to plurality of switches 509 in any configuration or by any means and be within the scope of the invention.

In an embodiment, reconfiguring means 520 allows N/2 slot switch module 502 to be reconfigured in a post-manufactured state 522 to either a left-hand slot switch configuration or a right-hand slot switch configuration. Any reconfiguring occurring after the initial manufacturing of N/2 slot switch module 502 can be considered reconfiguring in the post-manufactured state 522. For example, and without limitation, reconfiguring of N/2 slot switch module 502 that occurs after one or more switches 509 are coupled to switch card 504 and plurality of links 506 can be considered reconfiguring in a post-manufactured state 522.

In an embodiment, reconfiguring means 520 allows N/2 slot switch module 502 to be reconfigured in a post-manufactured state 522 to support bladed architecture, backplane-based network 500 in a plurality of sub-optimal configurations. Several exemplary embodiments of sub-optimal configurations are illustrated in FIGS. 6-10, although these embodiments are not limiting of the invention.

Reconfiguring means 520 can be implemented using hardware, software, or hardware implementing software. For example, and without limitation, reconfiguring means 520 can be implemented in hardware using resistor stuffing, header blocks or a passive mezzanine card or connector on switch card 504. In an embodiment, resistor stuffing can include soldering/removing resistors after manufacture to configure/reconfigure N/2 slot switch module 502 to one of a left-hand slot switch configuration or a right-hand slot switch configuration. In another embodiment, reconfiguring means 520 can include using shorting blocks such that a given set of jumper connections between one or more switches 509, plurality of links 506, and the like, can be made in post-manufactured state 522 to configure/reconfigure N/2 slot switch module 502 as one of a left-hand slot switch configuration or a right-hand slot switch configuration. In still another embodiment, reconfiguring means 520 can be a connector such that an expansion card or mezzanine card can be coupled to reconfiguring means to configure/reconfigure N/2 slot switch module 502 to one of a left-hand slot switch configuration or a right-hand slot switch configuration. In this embodiment, mezzanine card can have a configuration such that one or more switches 509 and plurality of links 506 are coupled to produce the desired left-hand or right-hand configuration.

In still yet another embodiment, reconfiguring means 520 can include a processor, memory and a set of operating instructions to configure/reconfigure N/2 slot switch module 502 to left-hand slot switch configuration or right-hand slot switch configuration. Operating instructions, or software, can be programmed into reconfiguring means 520 in post-manufactured state 522 such that plurality of links 506 and one or more switches 509 are configured as desired for bladed architecture, backplane based network 500.

In an embodiment of the invention, N/2 slot switch module 502 is user-reconfigurable. In operation, N/2 slot switch module 502 can be removed from bladed architecture, backplane-based network 500, reconfigured by a user, for example, into a left-hand or right-hand slot switch configuration, and re-inserted into network 500. This offers the advantage of flexibility and low cost as N/2 slot switch module 502 can be easily reconfigured by a user to adapt changes in network 500. In addition, N/2 slot switch module can be reused as the network grows. Also, a separate N/2 slot switch module 502 isn't needed for each network configuration. This lowers the cost in maintaining an ever-evolving network 500.

The exemplary embodiments of reconfiguring means 520 discussed above are not limiting of the invention. Also, the configuring/reconfiguring of N/2 slot switch module 502 into either a left-hand or a right-hand slot switch configuration is not limiting of the invention. Any reconfiguring means 520 is within the scope of the invention. In addition, any reconfiguration of N/2 slot switch module 502 in a post-manufactured state 522 is within the scope of the invention.

Although N/2 slot switch module 502 is shown in FIG. 5 in left-hand switch slot 524 and in a left-hand slot switch configuration, these are not limiting of the invention. Reconfiguring means 520 can be used to place N/2 slot switch module 502 in any number of configurations as the following exemplary embodiments illustrate.

In an embodiment, N/2 slot switch module 502 can be in the right-hand switch slot 526 and in a right-hand slot switch configuration. In this embodiment, one or more switches 509 can be coupled to right-hand set of payload slots 512 via right-hand switch card link interface 523 and right links 518.

In another embodiment, N/2 slot switch module 502 can be in the right-hand switch slot 526 and be in a left-hand slot switch configuration. In this embodiment, one or more switches 509 can be coupled to left-hand set of payload slots 510 via left-hand switch card link interface 521 and right links 518.

In yet another embodiment, N/2 slot switch module 502 can be in the left-hand switch slot 524 and be in a right-hand slot switch configuration. In this embodiment, one or more switches 509 can be coupled to right-hand set of payload slots 512 via right-hand switch card link interface 523 and left links 516.

These aforementioned embodiments are exemplary and not limiting of the invention. Reconfiguring means 520 can be used to place N/2 slot switch module in other configurations and be within the scope of the invention.

Figure 6:
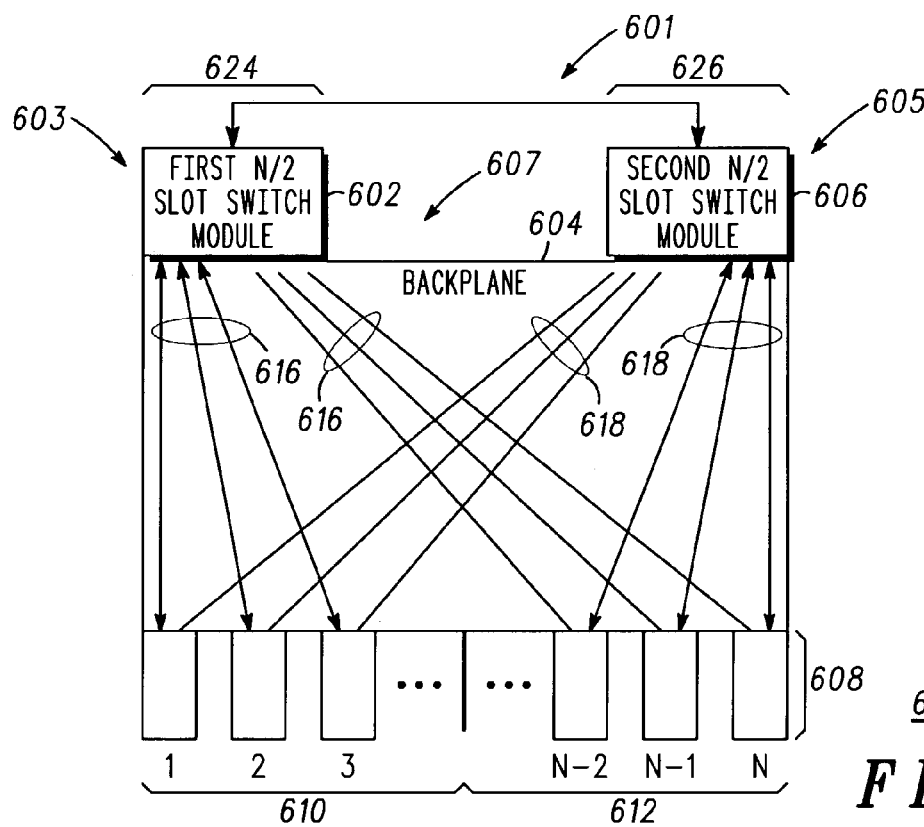
FIG. 6 depicts a computer network according to an embodiment of the invention.

FIG. 6 depicts a computer network 600 according to an embodiment of the invention. As shown in FIG. 6, network 600 includes first N/2 slot switch module 602 and second N/2 slot switch module 606 coupled to backplane 604 of a chassis with N payload slots 608. First N/2 slot switch module 602 and second N/2 slot switch module 606 are reconfigurable to one of a left-hand slot switch configuration 603 and a right-hand slot switch configuration 605. In the embodiment shown, first N/2 slot switch module 602 and second N/2 slot switch module 606 are coupled to N/2 of N payload slots 608 such that network 600 is in a sub-optimal configuration 601.

Network 600 also includes N payload slots 608 divided into left-hand set of payload slots 610 and right-hand set of payload slots 612. Network 600 can be a bladed architecture, backplane-based network 600. In an embodiment, network 600 can be a switched fabric network 607. As shown, network 600 is in sub-optimal configuration 601 since any of the N payload slots 608 are disconnected from at least one of the first N/2 slot switch module 602 and the second N/2 slot switch module 606. Also, sub-optimal configuration 601 comprises when at least one the first N/2 slot switch module 602 and the second N/2 slot switch module 606 are disconnected from any of the N payload slots 608.

As shown in FIG. 6, first N/2 slot switch module 602 is configured in a left-hand slot switch configuration 603 and is coupled to the left-hand set of payload slots 610 via left links 616 (as indicated by the completed arrow lines). Since first N/2 slot switch module 602 is in the left-hand slot switch configuration 603 and placed in left-hand switch slot 624, it can only be coupled to the left-hand set of payload slots 610. Second N/2 slot switch module 606 is configured in a right-hand slot switch configuration 605 and is coupled to the right-hand set of payload slots 612 via right links 618 (as indicated by the completed arrow lines). Since second N/2 slot switch module 606 is in the right-hand slot switch configuration 605 and placed in right-hand switch slot 626, it can only be coupled to the right-hand set of payload slots 612.

In another embodiment, first N/2 slot switch module 602 can be configured in a right-hand slot switch configuration 605, placed in left-hand switch slot 624 and be coupled to right-hand set of payload slots 612 via left links 616. Also, second N/2 slot switch module 606 can be configured in a left-hand slot switch configuration 603, placed in right-hand switch slot 626 and be coupled to left-hand set of payload slots 610 via right links 618. This embodiment is not operationally different from the previous embodiment, but merely swaps which set of payload slots are coupled to which N/2 slot switch module.

Network 600 can be considered a full-shelf, half-bandwidth network. Network 600 is full-shelf because each of the N payload slots 608 is active as they are coupled to one switch module. Therefore, each of the N payload slots 608 can interface with network 600, and network 600 can see each of the N payload slots 608. Therefore, if a payload module is inserted into any of the N payload slots 608, the functionality of a payload module can be added to network 600. Network 600 is half-bandwidth because each of the N payload slots 608 is coupled to only one switch module. Therefore, there is no redundancy in the network and payload module can only send and receive data to/from one switch module, thereby limiting the data transfer rate between payload module and the rest of the network 600. For example, if the first N/2 slot switch module 602 malfunctions or is taken off-line, left-hand set of payload slots 610 and their corresponding payload modules will be disconnected from network 600. Analogously, if the second N/2 slot switch module 606 malfunctions or is taken off-line, right-hand set of payload slots 612 will be disconnected from network 600. Therefore, network 600 is considered to be at only half-bandwidth.

In each of the embodiments associated with FIG. 6, first N/2 slot switch module 602 and second N/2 slot switch module 606 are reconfigurable between left-hand slot switch configuration 603 and right-hand slot switch configuration 605. In an embodiment, first N/2 slot switch module 602 and second N/2 slot switch module 606 are reconfigurable in a post-manufactured state 522 and are user-reconfigurable. In other words, first N/2 slot switch module 602 and second N/2 slot switch module 606 can be reconfigurable after manufacture, by a user, to modify network 600 configurations and power any combination of N payload slots 608 and associated payload modules as described above.

Figure 7:
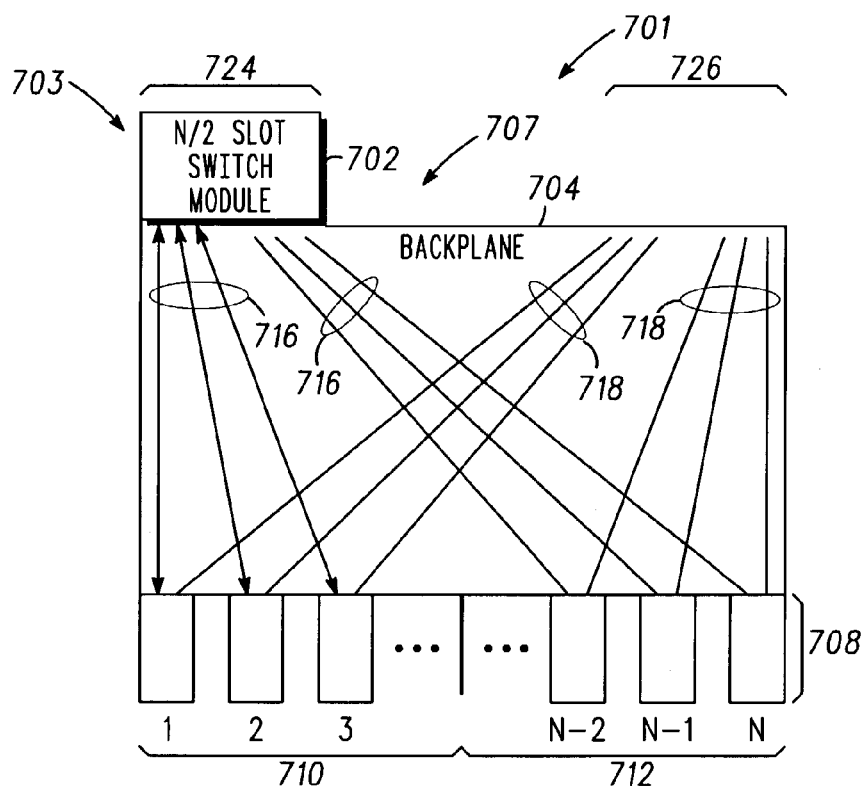
FIG. 7 depicts a computer network according to another embodiment of the invention.

FIG. 7 depicts a computer network 700 according to another embodiment of the invention. As shown in FIG. 7, network 700 includes N/2 slot switch module 702 coupled to backplane 704 of a chassis with N payload slots 708. N/2 slot switch module 702 is reconfigurable to one of a left-hand slot switch configuration 703 and a right-hand slot switch configuration (not shown in this Figure). In the embodiment shown, N/2 slot switch module 702 is coupled to N/2 of N payload slots 708 such that network 700 is in a sub-optimal configuration 701.

Network 700 also includes N payload slots 708 divided into left-hand set of payload slots 710 and right-hand set of payload slots 712. Network 700 can be a bladed architecture, backplane-based network. In an embodiment, network 700 can be a switched fabric network 707. As shown, network 700 is in sub-optimal configuration 701 since one or more of the N payload slots 708 are disconnected from at least one of N/2 slot switch modules 702. Also, sub-optimal configuration 701 comprises when N/2 slot switch module 702 is disconnected from any of the N payload slots 708.

As shown in FIG. 7, N/2 slot switch module 702 is configured in a left-hand slot switch configuration 703 and is coupled to the left-hand set of payload slots 710 via left links 716 (as indicated by the completed arrow lines). Since N/2 slot switch module 702 is in the left-hand slot switch configuration 703 and placed in left-hand switch slot 724, it can only be coupled to the left-hand set of payload slots 710.

In another embodiment, N/2 slot switch module 702 can be configured in a left-hand slot switch configuration 703 and placed in right-hand switch slot 726. This yields the same operational configuration as in the previous embodiment, but now left-hand set of payload slots 710 get network access through right links 718. In yet another embodiment, N/2 slot switch module 702 can be configured in a right-hand slot switch configuration and placed in left-hand switch slot 726. This configuration gives right-hand set of payload slots 712 network access through left links 716. In still another embodiment, N/2 slot switch module 702 can be configured in a right-hand slot switch configuration 703 and placed in right-hand switch slot 726. This configuration gives right-hand set of payload slots 712 network access through right links 718.

Network 700 can be considered a half-shelf, half-bandwidth network. Network 700 is half-shelf because only N/2 of the N payload slots 708 are active. Therefore, only N/2 the N payload slots 708 can interface with network 700, and network 700 can see only N/2 of the N payload slots 708. Therefore, if a payload module is inserted into one of the active N/2 of the N payload slots 708 (either one of left-hand set of payload slots 710 or right-hand set of payload slots 712 depending on the embodiment), the functionality of a payload module can be added to network 700. Network 700 is half-bandwidth because the N/2 of the N payload slots 708 are coupled to only one switch module. Therefore, there is no redundancy in the network and payload module can only send and receive data to/from one switch module, thereby limiting the data transfer rate between payload module and the rest of the network 700. For example in the embodiment shown, if N/2 slot switch module 702 malfunctions or is taken off-line, left-hand set of payload slots 710 and their corresponding payload modules will be disconnected from network 700. Therefore, network 700 is considered to be at only half-bandwidth.

In each of the embodiments associated with FIG. 7, N/2 slot switch module 702 is reconfigurable between left-hand slot switch configuration 703 and right-hand slot switch configuration. In an embodiment, N/2 slot switch module 702 is reconfigurable in a post-manufactured state 522 and is user-reconfigurable. In other words, N/2 slot switch module 702 can be reconfigurable after manufacture, by a user, to modify network 700 configurations and power any combination of N payload slots 708 and associated payload modules as described above.

Figure 8:
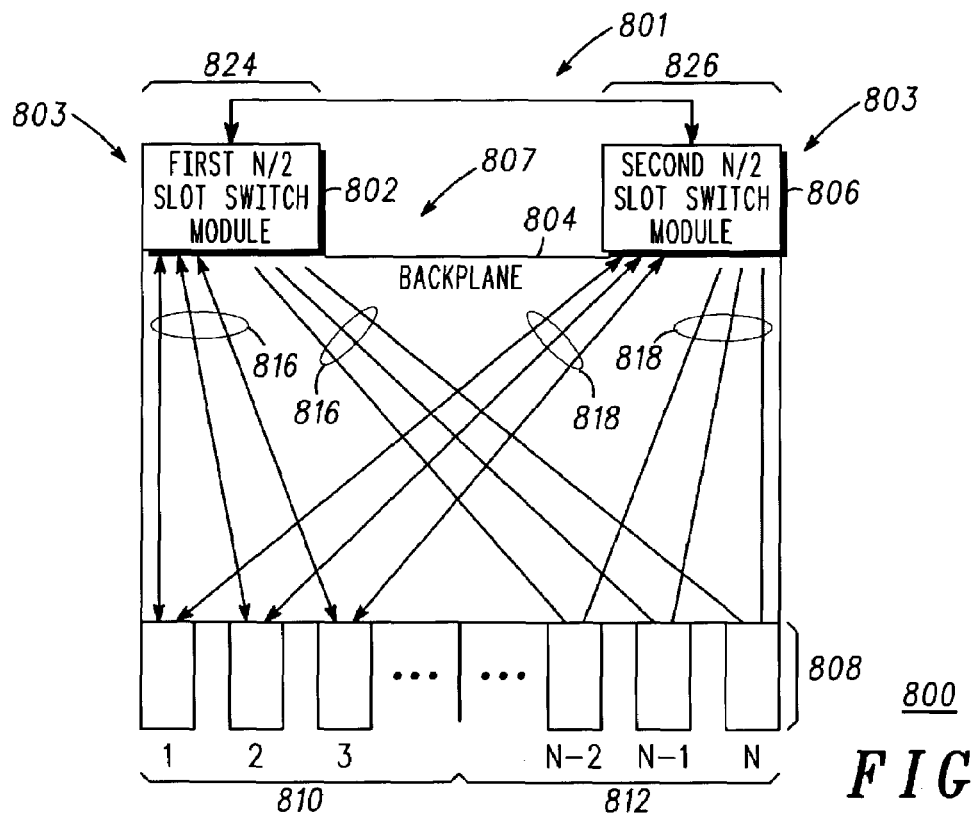
FIG. 8 depicts a computer network according to yet another embodiment of the invention.

FIG. 8 depicts a computer network 800 according to yet another embodiment of the invention. As shown in FIG. 8, network 800 includes first N/2 slot switch module 802 and second N/2 slot switch module 806 coupled to backplane 804 of a chassis with N payload slots 808. First N/2 slot switch module 802 and second N/2 slot switch module 806 are reconfigurable to one of a left-hand slot switch configuration 803 and a right-hand slot switch configuration. In the embodiment shown, first N/2 slot switch module 802 and second N/2 slot switch module 806 are coupled to N/2 of N payload slots 808 such that network 800 is in a sub-optimal configuration 801.

Network 800 also includes N payload slots 808 divided into left-hand set of payload slots 810 and right-hand set of payload slots 812. Network 800 can be a bladed architecture, backplane-based network. In an embodiment, network 800 can be a switched fabric network 807. As shown, network 800 is in sub-optimal configuration 801 since any of the N payload slots 808 are disconnected from at least one of the first N/2 slot switch module 802 and the second N/2 slot switch module 806. Also, sub-optimal configuration 801 comprises when at least one of the first N/2 slot switch module 802 and the second N/2 slot switch module 806 are disconnected from any of the N payload slots 808.

As shown in FIG. 8, first N/2 slot switch module 802 is configured in a left-hand slot switch configuration 803 and is coupled to the left-hand set of payload slots 810 via left links 816 (as indicated by the completed arrow lines). Since first N/2 slot switch module 802 is in the left-hand slot switch configuration 803 and placed in left-hand switch slot 824, it can only be coupled to the left-hand set of payload slots 810. Second N/2 slot switch module 806 is configured in a left-hand slot switch configuration 803 and is coupled to the left-hand set of payload slots 810 via right links 818 (as indicated by the completed arrow lines). Since second N/2 slot switch module 806 is in the left-hand slot switch configuration 803 and placed in right-hand switch slot 826, it can only be coupled to the left-hand set of payload slots 810.

In another embodiment, first N/2 slot switch module 802 and second N/2 slot switch module 806 are both configured in a right-hand slot switch configuration. This gives right-hand set of payload slots 812 network access through both first and second N/2 slot switch modules.

Network 800 can be considered a half-shelf, full-bandwidth network. Network 800 is a half-shelf because only N/2 of the N payload slots 808 are active, even though they are coupled to both switch modules. Therefore, only N/2 of the N payload slots 808 can interface with network 800, and network 800 can see only N/2 of the N payload slots 808. If a payload module is inserted into one of the active N/2 of the N payload slots 808 (in this embodiment the left-hand set of payload slots 810), the functionality of a payload module can be added to network 800. Network 800 is full-bandwidth because N/2 of the N payload slots 808 that are active are coupled to more than one switch module. Therefore, there is redundancy in the network 800 and the data transfer rate between a payload module and the rest of network is greater than if the payload module were connected to only one switch module. For example, if the first N/2 slot switch module 802 malfunctions or is taken off-line, left-hand set of payload slots 810 are still connected to network 800 via second N/2 slot switch module 806. Therefore, network 800 is considered to be at full-bandwidth.

In each of the embodiments associated with FIG. 8, first N/2 slot switch module 802 and second N/2 slot switch module 806 are reconfigurable between left-hand slot switch configuration 803 and right-hand slot switch configuration. In an embodiment, first N/2 slot switch module 802 and second N/2 slot switch module 806 are reconfigurable in a post-manufactured state 522 and are user-reconfigurable. In other words, first N/2 slot switch module 802 and second N/2 slot switch module 806 can be reconfigurable after manufacture, by a user, to modify network 800 configurations and power any combination of N payload slots 808 and associated payload modules as described above.

Figure 9:
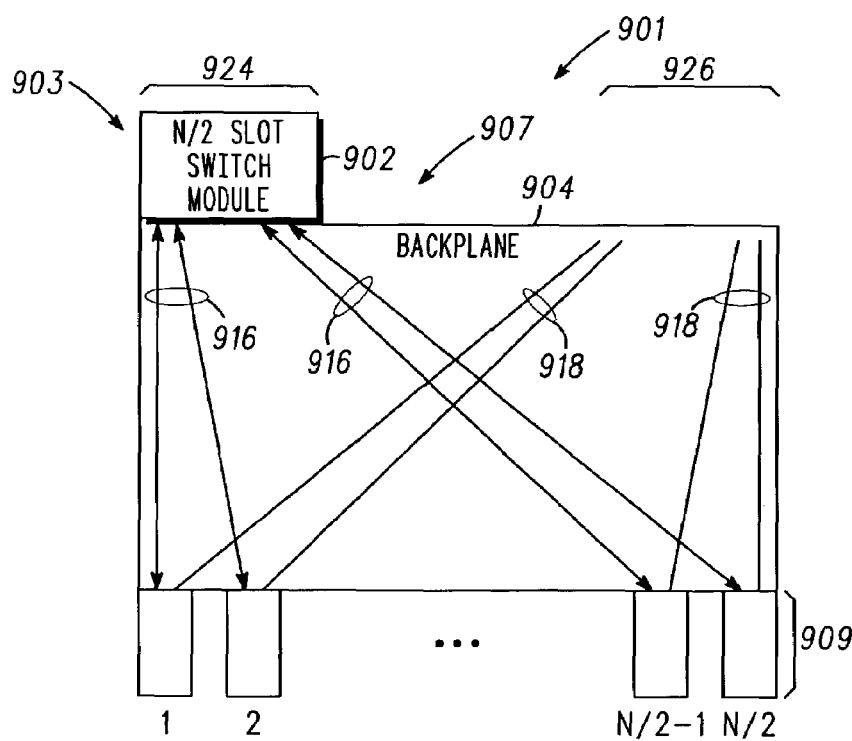
FIG. 9 depicts a computer network according to still another embodiment of the invention.

FIG. 9 depicts a computer network 900 according to still another embodiment of the invention. As shown in FIG. 9, network 900 includes N/2 slot switch module 902 coupled to backplane 904 of a chassis with N/2 payload slots 909. In this embodiment, N/2 slot switch module 902 is coupled to all of left links 916 and right links 918 in either left-hand switch slot 924 or right-hand switch slot 926 respectively. In the embodiment, N/2 slot switch module 902 is reconfigurable to one of a left-hand slot switch configuration 903 and a right-hand slot switch configuration (not shown in this Figure). In the embodiment shown, N/2 slot switch module 902 is coupled to N/2 of N/2 payload slots 909 such that network 900 is in a sub-optimal configuration 901.

Network 900 can be a bladed architecture, backplane-based network. In an embodiment, network 900 can be a switched fabric network 907. As shown, network 900 is in sub-optimal configuration 901 since any of the N/2 payload slots 909 are disconnected from at least one of the two N/2 slot switch modules 902. Also, sub-optimal configuration 901 comprises when N/2 slot switch module 902 is disconnected from any of the N/2 payload slots 909.

As shown in FIG. 9, N/2 slot switch module 902 is configured in a left-hand slot switch configuration 903, placed in left-hand switch slot 924 and is coupled to all of N/2 payload slots 909 via left links 916 (as indicated by the completed arrow lines). Although not shown, another embodiment includes N/2 slot switch module 902 configured in a left-hand slot switch configuration, placed in right-hand switch slot 926 and coupled to N/2 of N/2 payload slots 909 via right links 918.

Network 900 can be considered a full-shelf, half-bandwidth network. Network 800 is a full-shelf because each of the N/2 payload slots 909 is active as they are coupled to an N/2 slot switch module 902. Therefore, each of the N/2 payload slots 909 can interface with network 900, and network 900 can see each of the N/2 payload slots 909. Therefore, if a payload module is inserted into one of the active N/2 payload slots 909, the functionality of a payload module can be added to network 900. Network 900 is half-bandwidth because the N/2 payload slots 909 are coupled to only one switch module. Therefore, there is no redundancy in the network and payload module can only send and receive data to/from one switch module, thereby limiting the data transfer rate between payload module and the rest of the network 900. For example in the embodiment shown, if N/2 slot switch module 902 malfunctions or is taken off-line, N/2 payload slots 909 will be disconnected from network 900. Therefore, network 900 is considered to be at only half-bandwidth.

Figure 10:
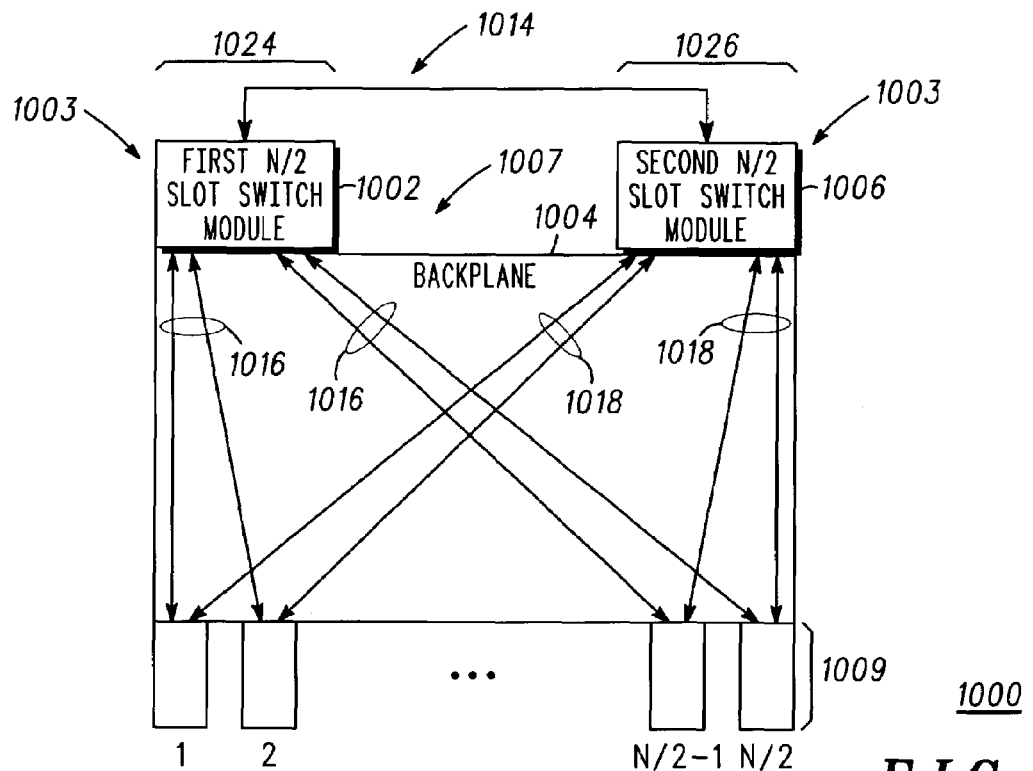
FIG. 10 depicts a computer network according to still yet another embodiment of the invention.

FIG. 10 depicts a computer network 1000 according to still yet another embodiment of the invention. As shown in FIG. 10, network 1000 includes first N/2 slot switch module 1002 and second N/2 slot switch module 1006 coupled to backplane 1004 of a chassis with N/2 payload slots 1009. In this embodiment, first N/2 slot switch module 1002 and second N/2 slot switch module 1006 are coupled to all of left links 1016 and right links 1018 in either left-hand switch slot 1024 or right-hand switch slot 1026 respectively. First N/2 slot switch module 1002 and second N/2 slot switch module 1006 are reconfigurable to one of a left-hand slot switch configuration 1003 and a right-hand slot switch configuration. In the embodiment shown, first N/2 slot switch module 1002 and second N/2 slot switch module 1006 are coupled to N/2 of N/2 payload slots 1009 such that network 1000 is in an optimal configuration 1014.

Network 1000 can be a bladed architecture, backplane-based network. In an embodiment, network 1000 can be a switched fabric network 1007. As shown, network 1000 is an optimal configuration 1014 as all of the N/2 payload slots 1009 are coupled to at least two switch modules. In this embodiment, N/2 payload slots 1009 are coupled to the first N/2 slot switch module 1002 and the second N/2 slot switch module 1006.

As shown in FIG. 10, first N/2 slot switch module 1002 is configured in a left-hand slot switch configuration 1003, placed in left-hand switch slot 1024 and is coupled to all of N/2 payload slots 1009 via left links 1016 (as indicated by the completed arrow lines). In this embodiment, even though first N/2 slot switch module 1002 is in left-hand switch slot configuration 1003 and placed in left-hand switch slot 1024, it is coupled to all of N/2 payload slots 1009 via left links 1016. Second N/2 slot switch module 1006 is configured in a left-hand slot switch configuration 1003, placed in right-hand switch slot 1026 and is coupled to all of N/2 payload slots 1009 via right links 1018. In this embodiment, even though second N/2 slot switch module 1006 is in left-hand switch slot configuration 1003 and placed in right-hand switch slot 1026, it is coupled to all of N/2 payload slots 1009 via right links 1018.

Network 1000 can be considered a full-shelf, full-bandwidth network. Network 1000 is full-shelf because all of N/2 payload slots 1009 are active as they are coupled to at least one switch module. Therefore, N/2 of the N/2 payload slots 1009 can interface with network 1000, and network 1000 can see N/2 of the N/2 payload slots 1009. Therefore, if a payload module is inserted into one of the active N/2 payload slots 1009, the functionality of a payload module can be added to network 1000. Network 1000 is full-bandwidth because N/2 of the N/2 payload slots 1009 that are active are coupled to more than one switch module. Therefore, there is redundancy in the network 1000 and the data transfer rate between a payload module and the rest of network is greater than if the payload module were connected to only one switch module. For example, if the first N/2 slot switch module 1002 malfunctions or is taken off-line, N/2 payload slots 1009 are still connected to network 1000 via second N/2 slot switch module 1006. Therefore, network 1000 is considered to be at full-bandwidth.

FIGS. 6-10 demonstrate the versatility and flexibility of an N/2 slot switch module that is reconfigurable in a post-manufactured state. The embodiments depicted in FIGS. 6-10 are exemplary and not limiting of the invention. Other network configurations and uses of N/2 slot switch module are within the scope of the invention.

Figure 11:
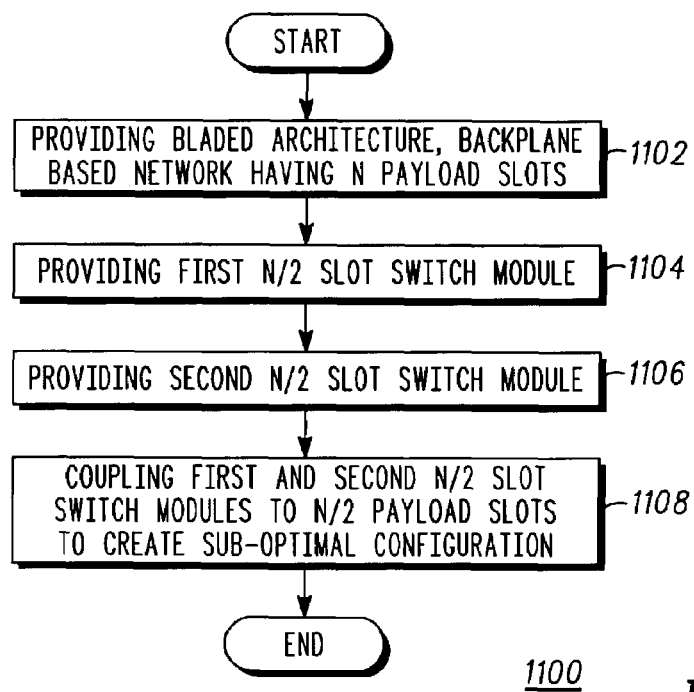
FIG. 11 illustrates a flow diagram of a method of the invention according to an embodiment of the invention.

FIG. 11 illustrates a flow diagram 1100 of a method of the invention according to an embodiment of the invention. Step 1102 provides a bladed architecture, backplane-based network having N payload slots. In an embodiment, bladed architecture, backplane-based network is a switched fabric network. Step 1104 provides a first N/2 slot switch module coupled to N/2 of the N payload slots, where the first N/2 slot switch module is reconfigurable to one of a left-hand slot switch configuration and a right-hand slot switch configuration.

Step 1106 provides a second N/2 slot switch module coupled to N/2 of the N payload slots, where the second N/2 slot switch module is reconfigurable to one of the left-hand slot switch configuration and the right-hand slot switch configuration. In an embodiment, first N/2 slot switch module and the second N/2 slot switch module are reconfigurable in a post-manufactured state. In another embodiment, the first N/2 slot switch module and the second N/2 slot switch module are user-reconfigurable.

In step 1108, the first N/2 slot switch module and the second N/2 slot switch module are coupled to N/2 of the N payload slots such that the bladed architecture, backplane-based network is in a sub-optimal configuration. In an embodiment, sub-optimal configuration comprises any of the N payload slots disconnected from at least one of the first N/2 slot switch module and the second N/2 slot switch module. In another embodiment, sub-optimal configuration comprises at least one of the first N/2 slot switch module and the second N/2 slot switch module disconnected from any of the N payload slots.

Figure 12:
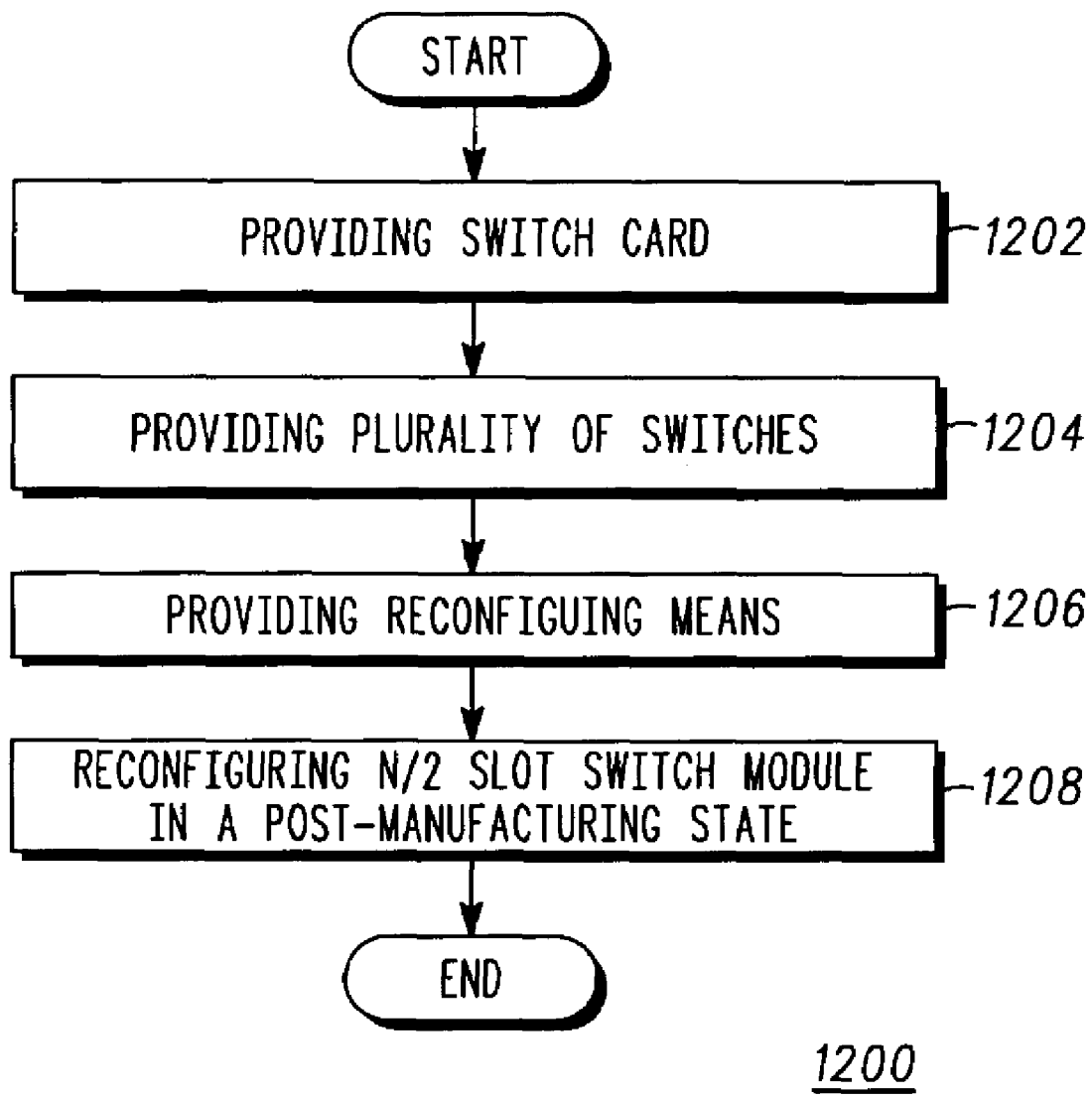
FIG. 12 illustrates a flow diagram of a method of the invention according to another embodiment of the invention.

FIG. 12 illustrates a flow diagram 1200 of a method of the invention according to another embodiment of the invention. Step 1202 provides a switch card having a plurality of links. In an embodiment, bladed architecture, backplane-based network is a switched fabric network.

Step 1204 provides a plurality of switches coupled to the switch card, where each of the plurality of switches is coupled to the plurality of links.

Step 1206 provides a reconfiguring means to reconfigure the N/2 slot switch module between the left-hand slot switch configuration and the right-hand slot switch configuration, where the reconfiguration occurs with the N/2 slot switch module in a post-manufactured state. In step 1208, the N/2 slot switch module is reconfigured between the left-hand slot switch configuration and the right-hand slot switch configuration while the N/2 slot switch module is in the post-manufactured state. The N/2 slot switch module is coupled to interface with a bladed architecture, backplane-based network having N payload slots. In an embodiment, the first N/2 slot switch module and the second N/2 slot switch module are user-reconfigurable.

While we have shown and described specific embodiments of the present invention, further modifications and improvements will occur to those skilled in the art. It is therefore, to be understood that appended claims are intended to cover all such modifications and changes as fall within the true spirit and scope of the invention.

The invention claimed is:

1. An N/2 slot switch module, comprising:
    a switch card;
    a plurality of switches coupled to the switch card; and
    a reconfiguring means connected to and integral to the switch card, wherein the reconfiguring means reconfigures the N/2 slot switch module into one of a left-hand slot switch configuration and a right-hand slot switch configuration, and wherein the N/2 slot switch module is coupled to interface with a bladed architecture, backplane-based network having N payload slots;
    wherein, when the N/2 slot switch module is configured in the left-hand switch configuration, the N/2 slot switch module can be coupled only to a left-hand set of the N payload slots, and wherein, when the N/2 slot switch module is configured in the right-hand slot switch configuration, the N/2 slot switch module can be coupled only to a right-hand set of the N payload slots.

2. The N/2 slot switch module of claim 1, wherein the N/2 slot switch module is coupled to N/2 slots of the N payload slots.

3. The N/2 slot switch module of claim 1, wherein the N/2 slot switch module is reconfigurable in a post-manufactured state.

4. The N/2 slot switch module of claim 1, wherein the N/2 slot switch module is user reconfigurable.

5. The N/2 slot switch module of claim 1, wherein the bladed architecture, backplane-based network is a switched fabric network.

6. A multi-service platform system, comprising:
    a bladed architecture backplane having N payload slots; and
    an N/2 slot switch module, wherein the N/2 slot switch module is reconfigurable to one of a left-hand slot switch configuration and a right-hand slot switch configuration, and wherein the N/2 slot switch module is coupled to N/2 of the N payload slots such that the multi-service platform system is in a sub-optimal configuration;
    wherein the N/2 slot switch module comprises a switch card, a plurality of switches coupled to the switch card, and a reconfiguring means connected to and integral to the switch card, wherein the reconfiguring means reconfigures the N/2 slot switch module into one of a left-hand slot switch configuration and a right-hand slot switch configuration, and wherein the N/2 slot switch module is coupled to interface with the bladed architecture, backplane-based network having N payload slots;
    wherein, when the N/2 slot switch module is configured in the left-hand switch configuration, the N/2 slot switch module can be coupled only to a left-hand set of the N payload slots, and wherein, when the N/2 slot switch module is configured in the right-hand slot switch configuration, the N/2 slot switch module can be coupled only to a right-hand set of the N payload slots.

7. The multi-service platform system of claim 6, wherein when the N/2 slot switch module is configured in the right-hand slot switch configuration, the N/2 slot switch module can be coupled only to a right-hand set of the N payload slots.

8. The multi-service platform system of claim 6, wherein the N/2 slot switch module is reconfigurable in a post-manufactured state.

9. The multi-service platform system of claim 6, wherein the N/2 slot switch module is user-reconfigurable.

10. The multi-service platform system of claim 6, wherein the bladed architecture, backplane-based network is a switched fabric network.

11. The multi-service platform system of claim 6, wherein the sub-optimal configuration comprises any of the N payload slots disconnected from at least one of the N/2 slot switch modules.

12. The multi-service platform system of claim 6, wherein the sub-optimal configuration comprises the N/2 slot switch module disconnected from any of the N payload slots.

* * * * *